(12) United States Patent
Stone et al.

(10) Patent No.: US 6,950,299 B2
(45) Date of Patent: Sep. 27, 2005

(54) NON-LINEAR CAPACITORS

(75) Inventors: Nicholas J. Stone, Cambridge (GB);
Paul A. Cain, Cambridge (GB);
Thomas M. Brown, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 0 days.

(21) Appl. No.: 10/777,677

(22) Filed: Feb. 13, 2004

(65) Prior Publication Data

US 2004/0223288 A1 Nov. 11, 2004

(30) Foreign Application Priority Data

Feb. 13, 2003 (GB) .............................................. 0303267
Dec. 4, 2003 (GB) .............................................. 0328171

(51) Int. Cl.$^7$ ............................................. H01G 4/228
(52) U.S. Cl. .............................. 361/306.1; 361/306.3; 361/301.4; 361/313; 361/321.1; 361/321.2; 257/313; 257/315
(58) Field of Search ........................... 361/306.1, 306.3, 361/301.4, 308.1, 313, 321.1, 321.2, 272, 278, 303, 305, 301.2, 277, 279, 281; 257/313, 315

(56) References Cited

U.S. PATENT DOCUMENTS

| 3,307,089 | A | | 2/1967 | Yamashita |
| 6,242,989 | B1 | * | 6/2001 | Barber et al. ........... 331/177 V |
| 6,344,662 | B1 | * | 2/2002 | Dimitrakopoulos et al. .. 257/40 |
| 6,380,600 | B1 | * | 4/2002 | Alping et al. ............... 257/415 |
| 6,674,116 | B1 | * | 1/2004 | Cao ........................... 257/312 |

FOREIGN PATENT DOCUMENTS

| GB | 1533657 A | 11/1978 |
| GB | 2311653 A | 10/1997 |
| WO | WO 03/052841 A1 | 6/2003 |

* cited by examiner

Primary Examiner—Dean A. Reichard
Assistant Examiner—Nguyen T. Ha
(74) Attorney, Agent, or Firm—Sughrue Mion, PLLC

(57) ABSTRACT

An electronic device including first, second and third conductor layers respectively arranged as the source, drain and gate electrodes of a field effect transistor, the third conductor layer being capacitively coupled with both the first and second conductor layers but with the second conductor layer to a greater degree than with the first conductor layer, wherein the electronic device is operable as a non-linear capacitor by applying an alternating voltage across the third conductor layer and the first conductor layer whilst leaving the second conductor layer at a floating potential. Also, an electronic device including a first pair of capacitively coupled first and second conductor layers and a second pair of capacitively coupled third and fourth conductor layers, wherein the first and third conductor layers and the second and fourth conductor layers are arranged as the drain and source electrodes of respective field effect transistors together with one or more gate electrodes conductively connected to either of the first and second conductor layers, wherein the electronic device is operable as a non-linear capacitor by applying an alternating voltage across the first and second conductor layers whilst leaving the third and fourth conductor layers at a floating potential.

6 Claims, 6 Drawing Sheets

(A)

(B)

(A)

(B)

(C)

(D)

NON-LINEAR CAPACITORS

FIELD OF THE INVENTION

This invention relates to devices for use as non-linear capacitors.

BACKGROUND OF THE INVENTION

Non-linear capacitors, i.e. capacitors whose capacitance depends on the applied voltage in a nonlinear fashion, are useful, for example, for signal mixing, i.e. for generating an output signal from the circuit that is at a different frequency from that of any of the signals applied to the input of the circuit. Such circuits are useful in many communication applications, where it is desirable that the response from the circuit is at a different frequency than the input signal.

SUMMARY OF THE INVENTION

It is an aim of the present invention to provide a new technique for achieving non-linear capacitance, preferably relatively large voltage-controlled capacitance changes of over 20%.

Large controllable changes in capacitance are useful, for example, in adjusting the frequency of an oscillator (such as a ring oscillator), by adjusting the node capacitance and hence the charging time of that node.

The present invention provides a use as a non-linear capacitor of an electronic device including first, second and third conductor layers respectively arranged as the source, drain and gate electrodes of a field effect transistor, the third conductor layer being capacitively coupled with both the first and second conductor layers, wherein the use includes applying an alternating voltage across the third conductor layer and either of the first and second conductor layers whilst leaving the other of the first and second conductor layers at a floating potential.

In one embodiment, the third conductor layer is capacitively coupled with the second conductor layer to a greater degree than with the first conductor layer, and wherein an alternating voltage is applied across the first and third conductor layers whilst leaving the second conductor layer at a floating potential.

The present invention also provides an electronic device including first, second and third conductor layers respectively arranged as the source, drain and gate electrodes of a field effect transistor, the third conductor layer being capacitively coupled with both the first and second conductor layers but with the second conductor layer to a greater degree than with the first conductor layer, wherein the electronic device is operable as a non-linear capacitor by applying an alternating voltage across the third conductor layer and the first conductor layer whilst leaving the second conductor layer at a floating potential.

The present invention also provides the use in a circuit for signal mixing of an electronic device including first, second and third conductor layers arranged as the drain, source and gate electrodes of a field effect transistor, the third conductor layer being capacitively coupled with both the first and second conductor layers, wherein the use includes applying an alternating signal voltage across the third conductor layer and either of the first and second conductor layers whilst leaving the other of the first and second conductor layers at a floating potential.

In one embodiment, at least one of the first, second and third conductor layers or any of the other layers constituting the field effect transistor is deposited by solution processing.

In one embodiment, the semiconducting layer of the field-effect transistor is a molecular organic semiconductor or a conjugated polymer semiconductor.

The present invention also provides an electronic device including a first pair of capacitively coupled first and second conductor layers and a second pair of capacitively coupled third and fourth conductor layers, wherein the first and third conductor layers and the second and fourth conductor layers are arranged as the drain and source electrodes of respective field effect transistors together with one or more gate electrodes conductively connected to either of the first and second conductor layers, wherein the electronic device is operable as a non-linear capacitor by applying an alternating voltage across the first and second conductor layers whilst leaving the third and fourth conductor layers at a floating potential.

In one embodiment, the first, second, third and fourth conductor layers and the one or more gate electrodes are provided on a total of two levels.

IN one embodiment, an alternating voltage is applied across the first and second conductor layers whilst leaving the third and fourth conductor layers at a floating potential.

The present invention also provides a circuit for signal mixing including an electronic device according to the present invention.

BRIEF DESCRIPTION OF THE DRAWINGS

Embodiments of the present invention will now be described, by way of example only, with reference to the accompanying drawings, in which.

DESCRIPTION OF PREFERRED EMBODIMENTS

Figure 2:
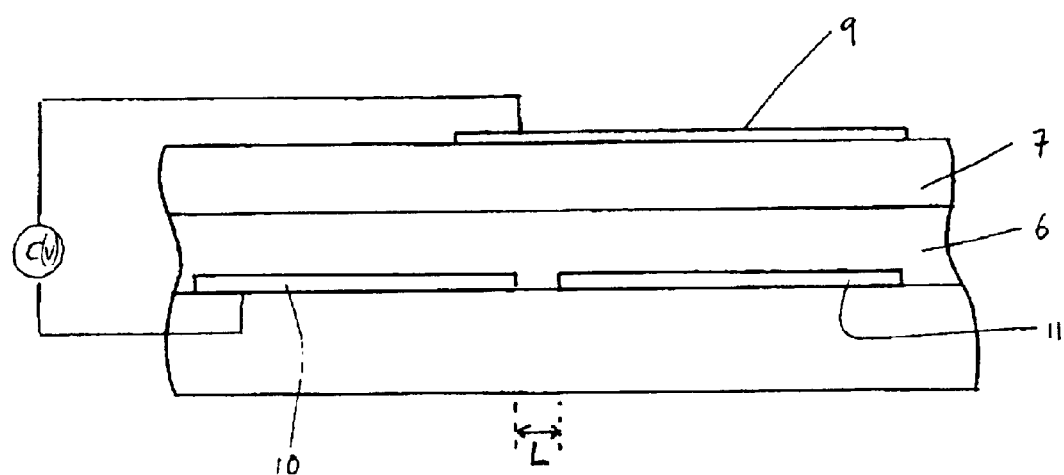
FIG. 2 is a schematic diagram of a non-linear capacitor according to a second embodiment of the present invention.

As shown in FIG. 2, a device for use as a non-linear capacitor according to a first embodiment of the present invention comprises two lower conductive layers (plates) 10, 11. The separation L between the two lower plates will form a channel for the transistor.

The substrate is then coated with a semiconductor 6 followed by a dielectric layer 7 and an upper conductive layer (plate) 9.

The two lower plates 10,11 effectively form the source and drain of a transistor, with a (very large) gate being formed by the upper plate. Applying a large enough negative (positive) bias to the upper plate will turn on the transistor for a normally off p-type (n-type) semiconducting layer, electrically linking the switchable lower plate to the permanent lower plate.

Figure 1:
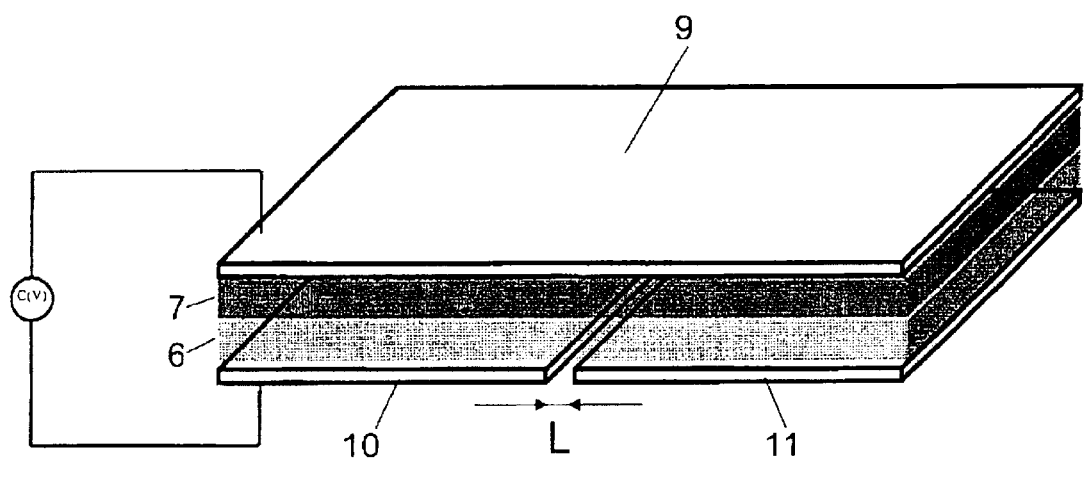
FIG. 1 is a schematic diagram of a device for use as a nonlinear active capacitor according to a first embodiment of the present invention.
Figure 1:
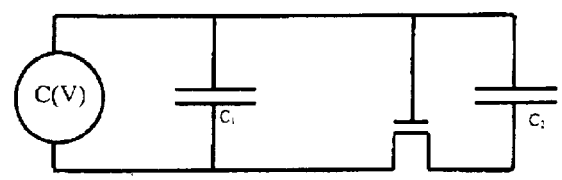

For a normally-off semiconductor, with a very small applied voltage ($<<V_{th}$, the threshold voltage of the TFT) between the upper plate 9 (~gate) and the permanent lower plate 10, the transistor will be off. In this regime the measured capacitance will be approximately due to the area of overlap between the upper plate 9 and permanent lower plate 10 only; the switchable lower plate 11 will be floating and so will contribute much less to the capacitance. When the applied bias is large enough (>$V_{th}$), the channel becomes conducting and the total size of the lower plate increases substantially and predictably. In the device of FIG. 1 the active plate area roughly doubles when the transistor turns on. This change in capacitance can be made as large as required by adjusting the size of the switchable lower plate 11 relative to the permanent plate 10. Thus very large changes in capacitance are achievable. In addition to the increase in capacitance due to the change in plate area, the capacitance will also increase due to the normal plate separation change when the semiconductor is turned on, as in a conventional MOS capacitor.

(If a large positive bias is applied to the upper plate of a p-type normally off transistor, no increase in capacitance will occur, since the channel remains non-conducting).

The upper plate 9 overlaps at least partially with both the permanent, source electrode, and the switchable, drain electrode. According to another embodiment of the invention shown in FIG. 2 the upper electrode overlaps with the source electrode only in a narrow region immediately adjacent to the channel, but overlaps with the drain electrode in a larger region, which extends significantly away from the channel. The upper electrode might overlap with the drain electrode over the whole area of the drain electrode.

The upper limit frequency $f_{max}$ at which the switchable plate can respond to an applied voltage and contribute to the increase of capacitance is determined by the mobility $\mu$ and the channel length L of the transistor, i.e. $f_{max} \sim \mu V/L^2$. In order to achieve operation at high frequencies in the MHz regime it is desirable to use a semiconducting material with a high mobility, and a small transistor channel length.

The capacitor will also be non-linear with respect to frequency, since when the transistor is on and both lower plates are active, the charging time of the switchable plate will be related to the mobility of the channel, and the channel length. At low frequency both plates will charge in sympathy to the ac voltage applied. Above a frequency $f_{max} \sim \mu V/L^2$, the charge will not be able to traverse the channel within the ac cycle time, and the switchable plate will no longer contribute significantly to the total capacitance. For the device shown in FIG. 1 this would correspond to an eventual halving in total capacitance above a certain frequency, when only the permanent plate is contributing to the total capacitance.

Figure 3:
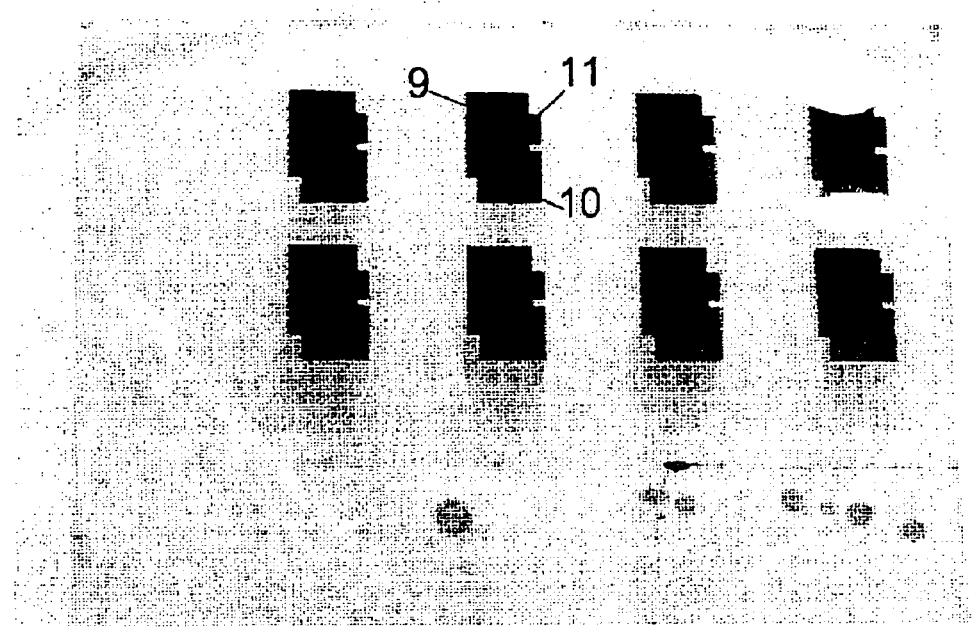
FIG. 3 is a microscope image of an array of fabricated devices of the kind shown in FIG. 1.
Figure 4:
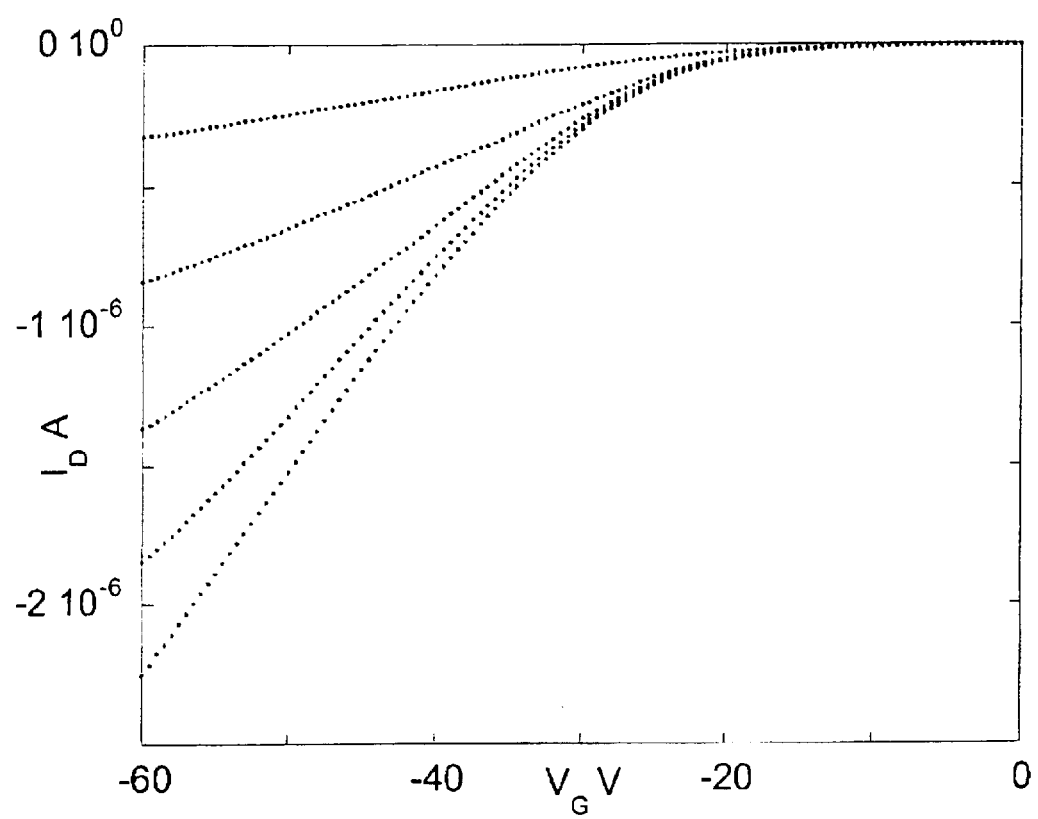
FIG. 4 shows the transfer characteristic of a device of the kind shown in FIG. 1.

Fabrication of a non-linear capacitor of this type has been achieved in the following way. The surface of a glass substrate is patterned with a hydrophobic polymer in order to define a channel length (in this case of 10 $\mu$m). Next, the permanent and switchable lower plates 10, 11 are inkjet printed, using a high conductivity PEDOT solution which runs up to and stops at the edge of the 10 $\mu$m hydrophobic region. A thin (~50 nm) semiconducting layer of a 9,9-dioctylfluorene-bithiophene copolymer (F8T2) was then spun on top of the chip, followed by a thicker (~800 nm) dielectric layer. Finally the upper plate was printed on top of the dielectric after some crude alignment to the lower layers. FIG. 3 shows an optical microscope image of an active capacitor made in this way. The top plate 9 is misaligned slightly to allow probe access to the lower permanent plate 10. FIG. 4 shows that the device behaves as a transistor when the two lower plates are source and drain, and the top plate is the gate.

Figure 5:
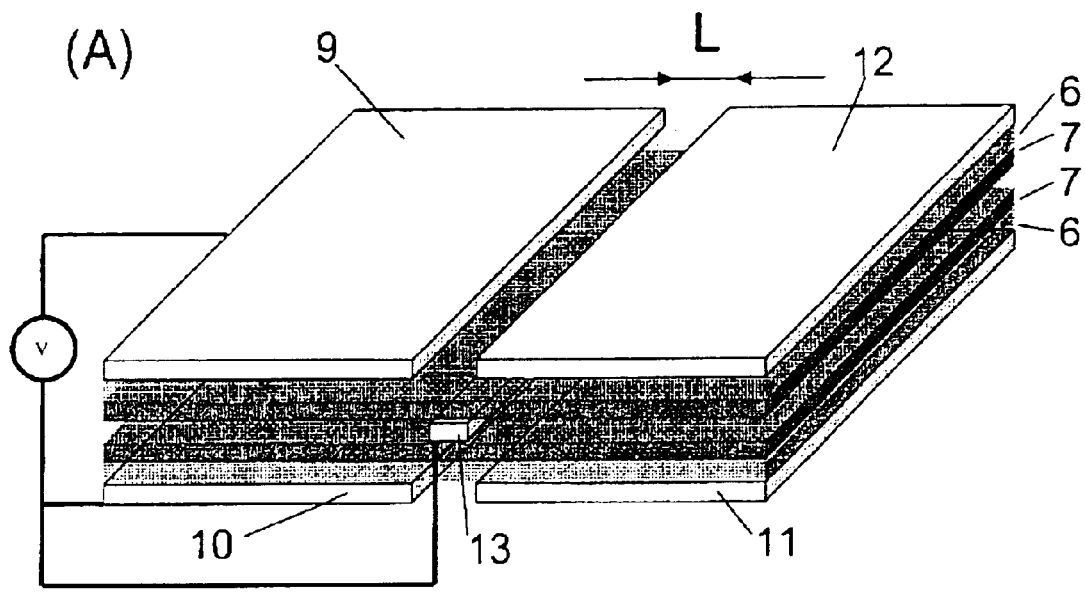
FIG. 5 is a schematic diagram of a device according to a third embodiment of the present invention.
Figure 5:
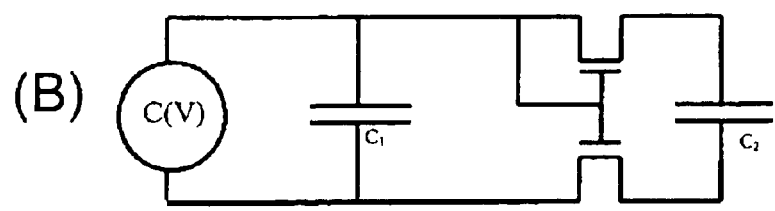

Another method of achieving a highly nonlinear capacitor according to a third embodiment of the present invention involves two vertically stacked transistors that share a gate sandwiched between the two channels. FIG. 5 is a schematic diagram of this structure. The lower plates 10,11 are separated by the channel length, L. On top of these plates is a semiconductor layer, 6, and a dielectric, 7. Application of a voltage to the gate, 13, electrically connects the two plates, 10,11. On top of this structure is another layer of dielectric, followed by another layer of semiconductor, and finally another pair of electrodes, 9,12. The structure is thus symmetric about the central gate 13, and when a voltage is applied to this gate 13, plates 10,11 become electrically connected, and also plates 9,12 become electrically connected. The capacitance therefore increases by the capacitance of the switchable pair of plates, 11,12.

In order to operate this as a two-terminal device, the central gate 13 is connected to either one of the two permanent plates 9,10 (since the structure is symmetric above and below the gate). For solution-processed polymer devices, this connection could be made by using a via hole interconnection, formed, for example, by solvent printing (as described in WO01/47043), laser ablation, photolithographic etching, or mechanical hole punching. For a normally off p-type (n-type) semiconductor, with no bias across the permanent plates, neither switchable plate is connected and the capacitance is due only to the two permanent plates. If a negative (positive) bias is applied to the permanent plate that is connected to the gate, then both channels can be turned on together, increasing the effective size of both upper and lower plate, thus increasing the overall capacitance. This design can provide an even bigger change in capacitance than the single TFT version described above, since both plates are adjusted in size.

Figure 6:
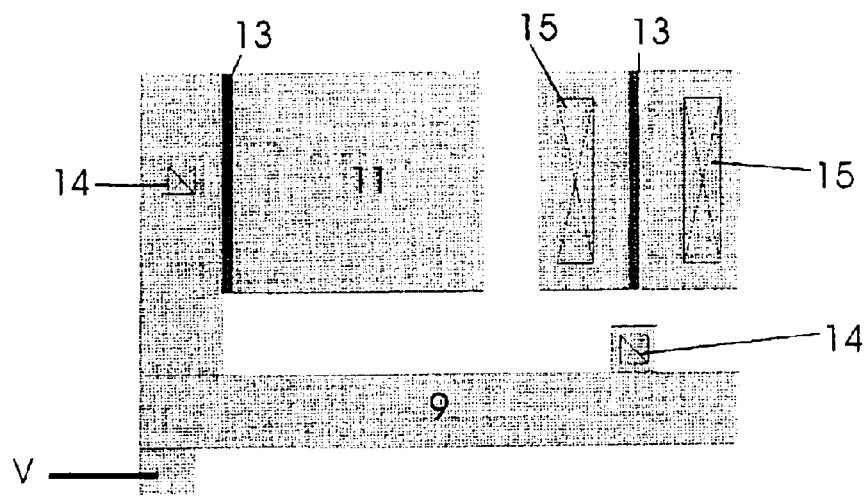
FIG. 6 is a schematic diagram of device according to a fourth embodiment of the present invention.
Figure 6:
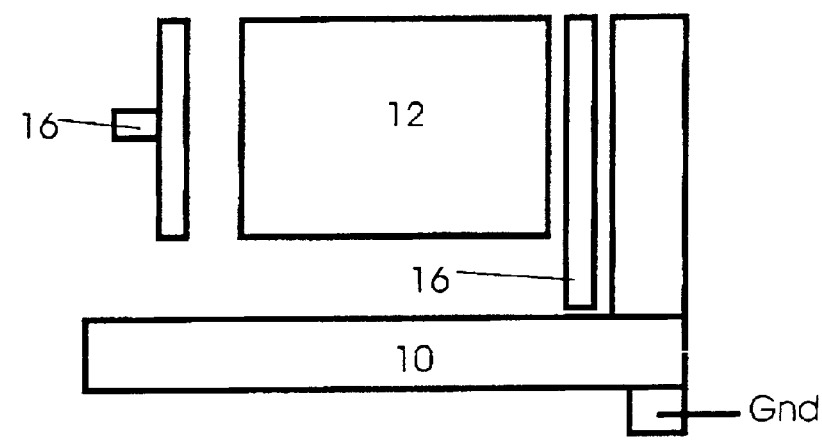
Figure 6:
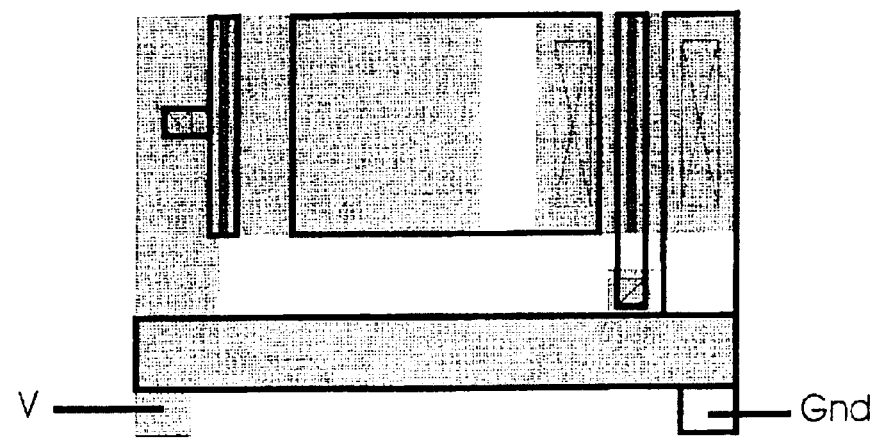
Figure 6:
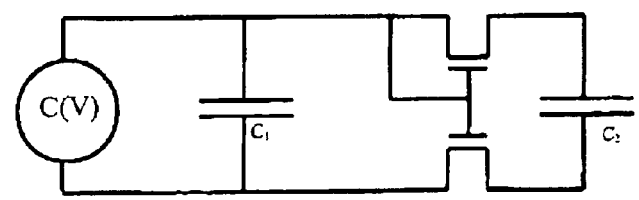

Another method of achieving a highly nonlinear capacitor according to a fourth embodiment of the present invention involves two transistors to switch on two additional plates, where both transistors are fabricated on the same lithographic level (in contrast to the previous method where they are vertically stacked). This structure is easier to realise than the previous. FIG. 6 is a schematic diagram of the structure. FIG. 6A shows the conducting plates fabricated on the lower lithographic level. Conducting region 9 will form part of the permanent capacitance with the upper level, and conducting region 11 will form part of the switchable capacitance. Conducting regions 9 and 11 are separated by a transistor channel 13. The crossed boxes 14, 15 are via holes allowing the upper layer to connect the lower layer at these points. The two vias labelled 14 are electrically connected to gates 16 in the upper level, so that the gates are maintained at the voltage of the lower permanent plate, 9. The other two via regions, 15, are connected via a transistor channel, 13, and these vias allow an upper level conducting region, 10 (permanent plate), to connect to a separate upper level conducting region, 11 (switchable plate) only when the transistor on the lower level is switched on.

FIG. 6C shows both upper and lower levels superimposed to show where the via holes connect to the gates and plates. When no voltage is applied across the permanent plates, 9,10, the voltage to the two TFT gates 16 is zero and the TFT is off. Therefore plate 9 is not connected to plate 11, and the two via regions 15 are not connected, so that plate 12 is not connected to plate 10. The capacitance is just that measured between the permanent plates.

When a bias is applied to the lower plate, both gates are biased, and both TFTs are turned on. Thus plate 11 is connected to plate 9 and the two via regions 15 are connected. This means that plate 10 is connected to plate 12 via the two via holes 15 and a TFT channel 13. The lower plate now has an area equal to the sum of areas 9 and 11, and the upper plate has an area equal to the sum of the areas 10 and 12. Thus the capacitance has increased substantially and controllably, depending on device dimensions.

FIG. 6D shows a schematic circuit diagram of the device, which is the same as that in FIG. 5B.

The devices described above can be fabricated entirely from polymers by solution processing, as has been described in detail above for the device of FIG. 1. The conducting plates/electrodes can be formed from electroactive photopolymers. One alternative, for example, is to form the conducting electrodes from inorganic conductors, that can, for example, be deposited by printing of a colloidal suspension or by electroplating onto a pre-patterned substrate, or from insoluble conductive material by, for example, vacuum-deposition.

Examples of materials for the semiconducting layer include solution processible conjugated polymeric or oligomeric materials that exhibit adequate field-effect mobilities exceeding $10^{-3}$ cm$^2$/Vs, preferably exceeding $10^{-2}$ cm$^2$/Vs. Suitable materials are reviewed for example in H. E. Katz, J. Mater. Chem. 7, 369 (1997), or Z. Bao, Advanced Materials 12, 227 (2000). Other possibilities for solution-processible materials include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)).

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. Ink-jet printing is considered to be particularly suitable for large area patterning with good registration, in particular for flexible plastic substrates.

Although preferably all layers and components of the device and circuit are deposited and patterned by solution processing and printing techniques, such as, for example, those described in WO01/47043, one or more components may also be deposited by vacuum deposition techniques and/or patterned by a photolithographic process.

As mentioned above, the present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A use as a non-linear capacitor of an electronic device including first, second and third conductor layers respectively arranged as the source, drain and gate electrodes of a field effect transistor, the third conductor layer being capacitively coupled with both the first and second conductor layers, wherein the use includes applying an alternating voltage across the third conductor layer and either of the first and second conductor layers whilst leaving the other of the first and second conductor layers at a floating potential.

2. A use according to claim 1 wherein the third conductor layer is capacitively coupled with the second conductor layer to a greater degree than with the first conductor layer, and wherein an alternating voltage is applied across the first and third conductor layers whilst leaving the second conductor layer at a floating potential.

3. A use according to claim 1, wherein at least one of the first, second and third conductor layers or any of the other layers constituting the field effect transistor is deposited by solution processing.

4. A use according to claim 1, wherein the semiconducting layer of the field-effect transistor is a molecular organic semiconductor.

5. A use according to claim 1, wherein the semiconducting layer of the field-effect transistor is a conjugated polymer semiconductor.

6. A use as a non-linear capacitor of an electronic device including first, second and third conductor layers respectively arranged in fixed position with respect to each other as the source, drain and gate electrodes of a field effect transistor, the third conductor layer being capacitively coupled with both the first and second conductor layers, wherein the use includes applying an alternating voltage across the third conductor layer and either of the first and second conductor layers whilst leaving the other of the first and second conductor layers at a floating potential.

* * * * *